US012742097B2

(12) United States Patent
Singh et al.

(10) Patent No.: US 12,742,097 B2
(45) Date of Patent: Sep. 22, 2026

(54) COMPOSITIONS FOR POLISHING HARDMASKS AND RELATED SYSTEMS AND METHODS

(71) Applicant: ENTEGRIS, INC., Billerica, MA (US)

(72) Inventors: Rajiv K. Singh, Newberry, FL (US); Aditya Dilip Verma, Gainesville, FL (US); Sunny De, Oviedo, FL (US)

(73) Assignee: Entegris, Inc., Billerica, MA (US)

( * ) Notice: Subject to any disclaimer, the term of this patent is extended or adjusted under 35 U.S.C. 154(b) by 209 days.

(21) Appl. No.: 18/411,986

(22) Filed: Jan. 12, 2024

(65) Prior Publication Data

US 2024/0247168 A1 Jul. 25, 2024

Related U.S. Application Data

(60) Provisional application No. 63/440,194, filed on Jan. 20, 2023.

(51) Int. Cl.

| | |
|---|---|
| ***C09G 1/02*** | (2006.01) |
| ***B24B 1/00*** | (2006.01) |
| ***B24B 37/04*** | (2012.01) |
| ***C09G 1/00*** | (2006.01) |
| ***C09G 1/04*** | (2006.01) |
| ***C09G 1/06*** | (2006.01) |
| ***C09K 3/14*** | (2006.01) |
| ***C09K 13/06*** | (2006.01) |
| ***H10P 52/40*** | (2026.01) |

(52) U.S. Cl.

CPC .................. *C09G 1/02* (2013.01); *B24B 1/00* (2013.01); *B24B 37/044* (2013.01); *C09G 1/00* (2013.01); *C09G 1/04* (2013.01); *C09G 1/06* (2013.01); *C09K 3/1454* (2013.01); *C09K 3/1463* (2013.01); *C09K 13/06* (2013.01); *H10P 52/402* (2026.01); *H10P 52/403* (2026.01)

(58) Field of Classification Search

None

See application file for complete search history.

(56) References Cited

U.S. PATENT DOCUMENTS

| | | | | |
|---|---|---|---|---|
| 6,582,279 | B1 | 6/2003 | Fox | |
| 2014/0187043 | A1 | 7/2014 | Yoshida | |
| 2015/0104952 | A1 | 4/2015 | Cui | |
| 2016/0060488 | A1 | 3/2016 | Singh | |
| 2018/0298257 | A1 | 10/2018 | Li | |
| 2020/0002573 | A1* | 1/2020 | Kong | H01L 21/465 |
| 2021/0238448 | A1 | 8/2021 | Singh | |
| 2021/0403756 | A1* | 12/2021 | Kim | C09G 1/02 |
| 2023/0123263 | A1* | 4/2023 | Shin | C09K 3/1436 438/692 |

FOREIGN PATENT DOCUMENTS

| | | |
|---|---|---|
| TW | 202134364 A | 9/2021 |

* cited by examiner

*Primary Examiner* — Jiong-Ping Lu

(57) ABSTRACT

A system for polishing a hardmask comprises a composition comprising a permanganate ion of a permanganate oxidizer; a substrate comprising a hardmask that comprises at least one of a non-carbon boron component, a boron-carbon component, a non-carbon silicon component, a non-carbon chromium component, a non-carbon zirconium component, or any combination thereof; and a chemical mechanical planarization (CMP) apparatus configured to bring the composition and the substrate into contact so as to remove at least a portion of the hardmask of the substrate.

3 Claims, 2 Drawing Sheets

COMPOSITIONS FOR POLISHING HARDMASKS AND RELATED SYSTEMS AND METHODS

FIELD

The present disclosure relates to compositions for polishing hardmasks and related systems and related methods.

BACKGROUND

Substrates that have been planarized and polished can be patterned with materials having insulative, conductive, and semi-conductive properties. The resulting substrates can be useful in semiconductor manufacturing.

SUMMARY

Some embodiments relate to a system comprising a composition comprising a permanganate ion of a permanganate oxidizer; a substrate comprising a hardmask that comprises at least one of a non-carbon boron component, a boron-carbon component, a non-carbon silicon component, a non-carbon chromium component, a non-carbon zirconium component, or any combination thereof; and a chemical mechanical planarization (CMP) apparatus configured to bring the composition and the substrate into contact so as to remove at least a portion of the hardmask of the substrate.

Some embodiments relate to a method comprising one or more of the following steps: obtaining a substrate comprising a hardmask that comprises at least one of a boron component, a silicon component, a chromium component, a zirconium component, or any combination thereof; obtaining a composition comprising a permanganate ion of a permanganate oxidizer; and contacting the composition and the hardmask using a chemical mechanical planarization apparatus sufficient to remove at least a portion of the hardmask.

Some embodiments relate to a composition comprising a permanganate ion of a permanganate oxidizer. In some embodiments, the composition, when brought into contact with a hardmask using a chemical mechanical planarization apparatus, removes at least a portion of the hardmask. In some embodiments, the hardmask comprises at least one of a non-carbon boron component, a boron-carbon component, a non-carbon silicon component, a non-carbon chromium component, a non-carbon zirconium component, or any combination thereof.

BRIEF DESCRIPTION OF THE DRAWINGS

Some embodiments of the disclosure are herein described, by way of example only, with reference to the accompanying drawings. With specific reference now to the drawings in detail, it is stressed that the embodiments shown are by way of example and for purposes of illustrative discussion of embodiments of the disclosure. In this regard, the description taken with the drawings makes apparent to those skilled in the art how embodiments of the disclosure may be practiced.

DETAILED DESCRIPTION

Figure 1:
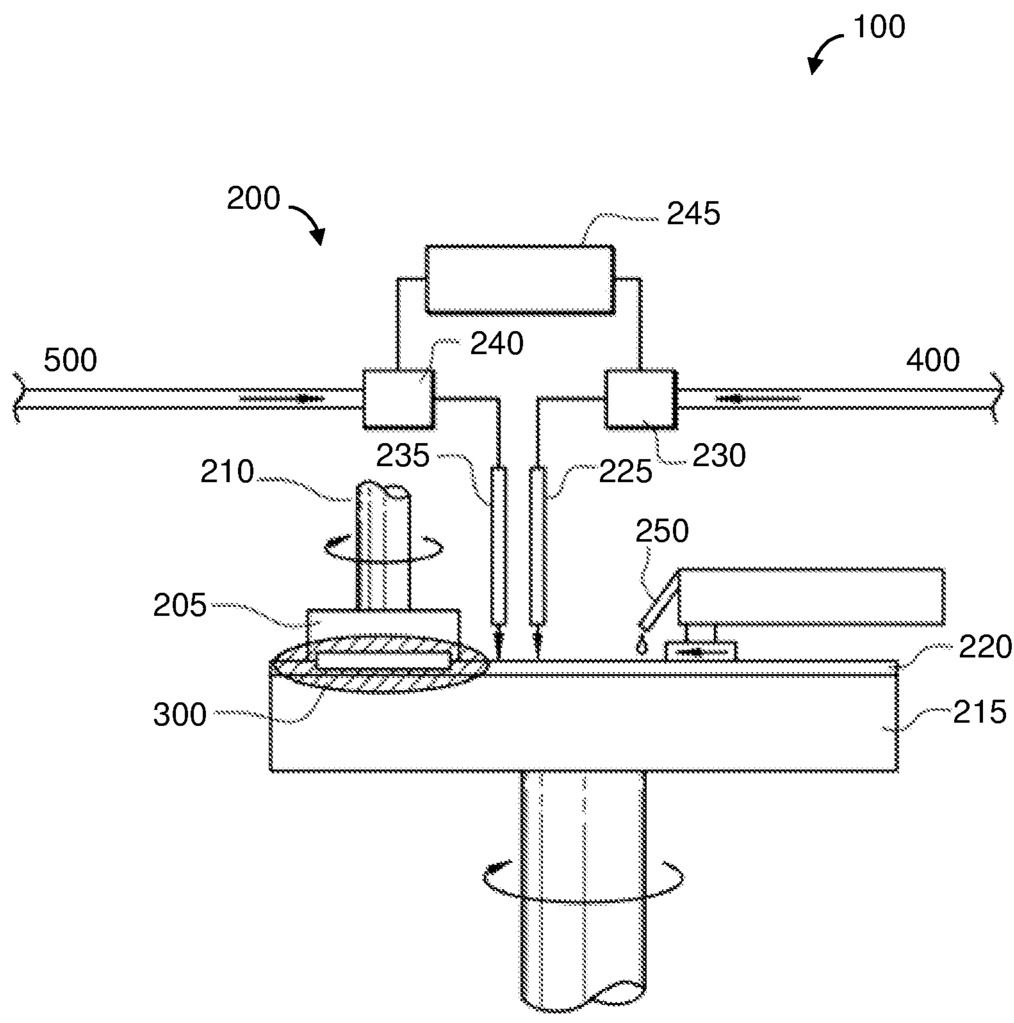
FIG. 1 is a schematic diagram of a system for polishing a hardmask, according to some embodiments.

Among those benefits and improvements that have been disclosed, other objects and advantages of this disclosure will become apparent from the following description taken in conjunction with the accompanying figures. Detailed embodiments of the present disclosure are disclosed herein; however, it is to be understood that the disclosed embodiments are merely illustrative of the disclosure that may be embodied in various forms. In addition, each of the examples given regarding the various embodiments of the disclosure which are intended to be illustrative, and not restrictive.

Any prior patents and publications referenced herein are incorporated by reference in their entireties.

Throughout the specification and claims, the following terms take the meanings explicitly associated herein, unless the context clearly dictates otherwise. The phrases "in one embodiment," "in an embodiment," and "in some embodiments" as used herein do not necessarily refer to the same embodiment(s), though it may. Furthermore, the phrases "in another embodiment" and "in some other embodiments" as used herein do not necessarily refer to a different embodiment, although it may. All embodiments of the disclosure are intended to be combinable without departing from the scope or spirit of the disclosure.

As used herein, the term "based on" is not exclusive and allows for being based on additional factors not described, unless the context clearly dictates otherwise. In addition, throughout the specification, the meaning of "a," "an," and "the" include plural references. The meaning of "in" includes "in" and "on."

Chemical mechanical planarization (CMP) is a process in which a material is removed from a surface of a substrate, such as a silicon wafer, and the surface is planarized and polished by a physical process (e.g., abrasion, etc.) and a chemical process (e.g., oxidation, chelation, etc.). To perform the CMP process, a slurry is applied to the surface of the substrate using a CMP apparatus which is configured to perform the removal, planarization, and polishing processes. To be suitable for polishing applications, a slurry should exhibit suitable performance with respect to selectivity and removal rate, while offering some degree of control and tunability with respect to the same. The slurry should also be tunable with respect to operational pH range, type of polishing pad, etc. When the material to be removed from the surface of the substrate is a hard material, or a hardmask, conventional slurries fail to meet the performance requirements for polishing such materials.

Embodiments disclosed herein provide compositions that overcome at least the challenges and shortcomings described above. For example, some embodiments relate to a composition comprising a permanganate ion of a permanganate oxidizer. The compositions disclosed herein may be useful for polishing a hardmask using a chemical mechanical planarization apparatus. The compositions disclosed herein may exhibit superior polishing performance with respect to selectivity and removal rate, while also providing control and tunability with respect to the same, as well as the operational pH range, the type of polishing pad, etc. Embodiments disclosed herein further provide related systems and related methods that comprise the compositions disclosed herein, among other things.

FIG. 1 is a schematic diagram of a system 100 for polishing a hardmask, according to some embodiments.

As shown in FIG. 1, the system 100 for polishing a hardmask comprises a chemical mechanical planarization apparatus (CMP apparatus 200). The CMP apparatus 200 comprises a polishing head 205 mounted on a carrier 210, a platen 215, and a polishing pad 220 on the platen 215. The polishing head 205 is configured to hold a substrate 300 and to bring the substrate 300 into contact with the polishing pad 220. The polishing pad 220 is configured to rotate to polish a surface of the substrate 300 using a composition 400. The composition 400 is supplied to the substrate 300 from an inlet 225. The inlet 225 is fluidly coupled to a valve 230 for delivering the composition 400 from a source (not shown). In some embodiments, a composition 500 is supplied to the substrate 300 from an inlet 235. The inlet 235 is fluidly coupled to a valve 240 for delivering the composition 500 from a source (not shown). In some embodiments, a process controller 245 (e.g., a microprocessor, a microcontroller, etc.) is communicably coupled to the valve 230 and the valve 240 for supplying the composition 400 and/or the composition 500 to the substrate 300. In some embodiments, the CMP apparatus 200 comprises a water supply 250.

The substrate 300 comprises a hard material on a surface of the substrate.

In some embodiments, the hard material is provided on a surface of a silicon wafer. In some embodiments, the hard material is present on the surface of the substrate in the form of a film. In some embodiments, the hard material on the surface of the substrate is referred to herein as a hardmask. In some embodiments, the hardmask does not comprise carbon. In some embodiments, the term "non-carbon," when used as a modifier, refers to a material which does not comprise carbon. In some embodiments, the hardmask comprises at least one of a non-carbon boron component, a non-carbon silicon component, a non-carbon chromium component, a non-carbon zirconium component, or any combination thereof. In some embodiments, the hardmask comprises boron and amorphous silicon. In some embodiments, the hardmask comprises chromium and chromium oxide. In some embodiments, the hardmask comprises polysilicon and doped polysilicon. In some embodiments, the hardmask comprises silica. In some embodiments, the hardmask comprises zirconia.

In some embodiments, the hardmask comprises or consists of a boron-carbon component. In some embodiments, the hardmask comprises or consists of boron and carbon. In some embodiments, the hardmask comprises or consists of a boron component and a carbon component.

In some embodiments, the hardmask comprises 1% to 99%, or any range or subrange therebetween, by weight of the boron component based on a total weight of the hardmask. In some embodiments, the hardmask comprises 10% to 99%, 20% to 99%, 30% to 99%, 40% to 99%, 50% to 99%, 60% to 99%, 65% to 99%, 70% to 99%, 75% to 99%, 80% to 99%, 85% to 99%, 90% to 99%, 95% to 99%, 1% to 90%, 1% to 80%, 1% to 70%, 1% to 60%, 1% to 50%, 1% to 40%, 1% to 30%, 1% to 20%, or 1% to 10% by weight of the boron component based on the total weight of the hardmask.

In some embodiments, the hardmask comprises 1% to 99%, or any range or subrange therebetween, by weight of the carbon component based on the total weight of the hardmask. In some embodiments, the hardmask comprises 10% to 99%, 20% to 99%, 30% to 99%, 40% to 99%, 50% to 99%, 60% to 99%, 65% to 99%, 70% to 99%, 75% to 99%, 80% to 99%, 85% to 99%, 90% to 99%, 95% to 99%, 1% to 90%, 1% to 80%, 1% to 70%, 1% to 60%, 1% to 50%, 1% to 40%, 1% to 30%, 1% to 20%, or 1% to 10% by weight of the carbon component based on the total weight of the hardmask.

The composition 400 comprises one or more components for polishing the hardmask on the surface of the substrate 300.

In some embodiments, the composition 400 comprises a permanganate ion of a permanganate oxidizer. In some embodiments, the permanganate oxidizer comprises at least one of sodium permanganate, potassium permanganate, lithium permanganate, barium permanganate, hydrogen permanganate, or any combination thereof. In some embodiments, the permanganate ion comprises $MnO^{-4}$.

In some embodiments, the composition 400 comprises at least one of an ion of a metal-oxy catalyst, an ion of an acid catalyst, or any combination thereof.

In some embodiments, the metal-oxy catalyst comprises at least one of an oxy-nitrate, an oxy-chloride, an oxy-sulfate, an oxy-carbonate, a $C_2$-$C_{10}$ oxy-alkanoate, or any combination thereof. In some embodiments, the metal-oxy catalyst comprises at least one of zirconium oxynitrate, zirconium oxychloride, nickel oxynitrate, nickel oxychloride, hafnium oxynitrate, hafnium oxychloride, zirconium oxy-alkanoates, or any combination thereof. In some embodiments, the ion of the metal-oxy catalyst comprises at least one of $ZrO^+$, $ZrO^{++}$, $NiO^+$, $ZrOH^+$, $HfO^+$, $HfOH^+$, $TiO^+$, $TiO^{++}$, or any combination thereof. In some embodiments, the acid catalyst comprises at least one of aluminum nitrate, aluminum chloride, ferric nitrate, ferric chloride, cupric nitrate, potassium chloride, manganese chloride, or any combination thereof. In some embodiments, the ion of the acid catalyst comprises at least one $Al^{3+}$, $Fe^+$, $Fe^{2+}$, $Fe^{3+}$, or any combination thereof.

In some embodiments, the composition comprises 0.2% to 6% by weight of the permanganate oxidizer, or any range or subrange therebetween, based on a total weight of the composition. In some embodiments, the composition comprises 0.2% to 5.5%, 0.2% to 5%, 0.2% to 4.5%, 0.2% to 4%, 0.2% to 3.5%, 0.2% to 3%, 0.2% to 2.5%, 0.2% to 2%, 0.2% to 1.5%, 0.2% to 1%, 0.2% to 0.5%, 0.5% to 6%, 1% to 6%, 1.5% to 6%, 2% to 6%, 2.5% to 6%, 3% to 6%, 3.5% to 6%, 4% to 6%, 4.5% to 6%, 5% to 6%, 5.5% to 6% by weight of the permanganate oxidizer based on the total weight of the composition.

In some embodiments, the composition comprises 0.01% to 2% by weight of the catalyst, or any range or subrange therebetween, based on the total weight of the composition. In some embodiments, the composition comprises 0.1% to 2%, 0.2% to 2%, 0.3% to 2%, 0.4% to 2%, 0.5% to 2%, 0.6% to 2%, 0.7% to 2%, 0.8% to 2%, 0.9% to 2%, 1.1% to 2%, 1.2% to 2%, 1.3% to 2%, 1.4% to 2%, 1.5% to 2%, 1.6% to 2%, 1.7% to 2%, 1.8% to 2%, 1.9% to 2%, 0.01% to 1.9%, 0.01% to 1.8%, 0.01% to 1.7%, 0.01% to 1.6%, 0.01% to 1.5%, 0.01% to 1.4%, 0.01% to 1.3%, 0.01% to 1.2%, 0.01% to 1.1%, 0.01% to 1%, 0.01% to 0.9%, 0.01% to 0.8%, 0.01% to 0.7%, 0.01% to 0.6%, 0.01% to 0.5%, 0.01% to 0.4%, 0.01% to 0.3%, 0.01% to 0.2%, or 0.01% to 0.1% by weight of the catalyst based on the total weight of the composition.

In some embodiments, the composition 400 comprises abrasive particles. In some embodiments, the abrasive particles comprise an oxide, a hydrated metal oxide, or any combination thereof. In some embodiments, the abrasive particles comprise at least one of manganese oxide, zirconia, silica, alumina, alpha alumina, alumina-ceria, ceria, or any combination thereof. In some embodiments, the abrasive particles comprise a coating comprising at least one of manganese oxide, zirconia, silica, alumina, alpha alumina, alumina-ceria, ceria, or any combination thereof. In some embodiments, the abrasive particles have a Mohs hardness of 2 to 9, 2 to 8, 2 to 7, 2 to 6, 2 to 5, 2 to 4, 2 to 3, 3 to 9, 4 to 9, 5 to 9, 6 to 9, 7 to 9, or 8 to 9.

In some embodiments, the composition 400 comprises a pH adjuster. In some embodiments, the pH adjuster comprises at least one of an inorganic acid, a metal salt, an organic acid, an organic hydroxide, or any combination thereof. In some embodiments, the metal salt comprises at least one of a metal nitrate, a metal hydroxide, or any combination thereof. In some embodiments, the pH adjuster comprises at least one of $H_2SO_4$, $HNO_3$, HF, $H_3PO_4$, HCl, $Al(NO_3)_3$, $Mn(NO_3)_2$, $Zr(NO_3)_2$, $Fe(NO_3)_3$, KOH, NaOH, $Al(OH)_3$, $CH_3SO_3H$, polystyrene sulfonic acid (PSSA), toluenesulfonic acid, salicylic acid, oxalic acid, succinic acid, citric acid, malic acid, lactic acid, fumaric acid, $NH_4OH$, choline hydroxide, or any combination thereof.

In some embodiments, the composition 400 has a pH of 2 to 5. In some embodiments, the composition 400 has a pH of 2 to 4. In some embodiments, the composition 400 has a pH of 2 to 3. In some embodiments, the composition 400 has a pH of 3 to 5. In some embodiments, the composition 400 has a pH of 4 to 5.

In some embodiments, the composition 400 does not comprise hydrogen peroxide.

The composition 500 is optional and can comprise one or more components of the composition 400.

In some embodiments, the composition 500 is same or similar to the composition 400. In some embodiments, the composition 500 is different from the composition 400. In some embodiments, the composition 500 comprises any one or more of the components described above with respect to the composition 400.

Regarding at least the composition 400 and the composition 500, the following U.S. Patent Applications are incorporated herein by reference in their respective entirety for all purposes: U.S. patent application Ser. No. 17/232,947, filed on Apr. 16, 2021 and entitled "CMP COMPOSITIONS FOR POLISHING DIELECTRIC MATERIALS" and U.S. patent application Ser. No. 17/163,372, filed on Jan. 30, 2021 and entitled "CMP COMPOSITIONS FOR POLISHING HARD MATERIALS."

Some embodiments relate to compositions for polishing hardmasks. The compositions for polishing hardmasks may comprise any of the compositions disclosed herein. In some embodiments, the composition comprises a permanganate ion of a permanganate oxidizer. In some embodiments, the composition, when brought into contact with a hardmask using a chemical mechanical planarization apparatus, removes at least a portion of the hardmask. In some embodiments, the hardmask comprises at least one of a non-carbon boron component, a boron-carbon component, a non-carbon silicon component, a non-carbon chromium component, a non-carbon zirconium component, or any combination thereof.

Figure 2:
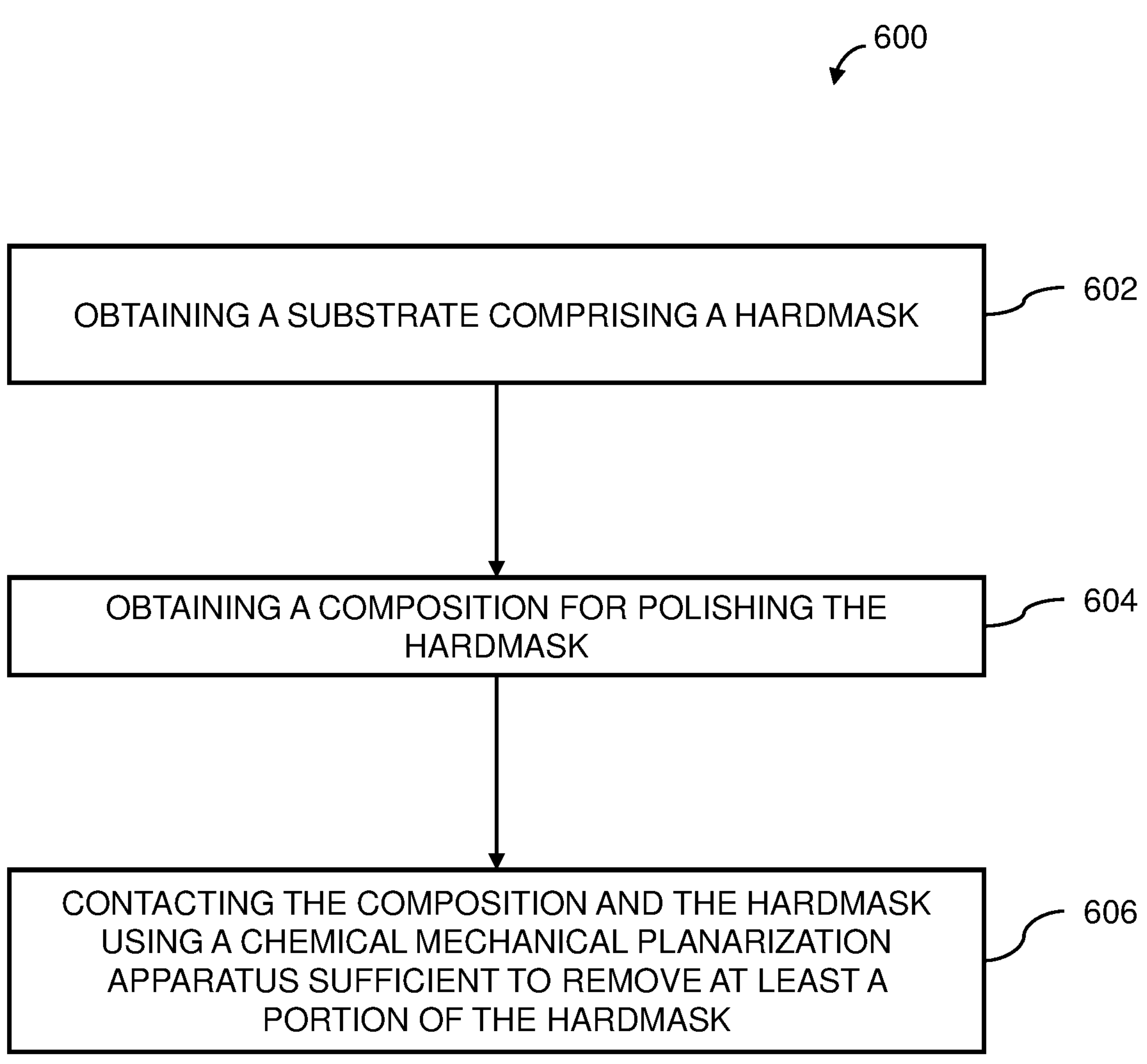
FIG. 2 is a flowchart of a method for polishing a hardmask, according to some embodiments.

FIG. 2 is a flowchart of a method 600 for polishing a hardmask, according to some embodiments. The method 600 for polishing a hardmask may comprise one or more of the steps presented in FIG. 2. In some embodiments, the method 600 comprises a step 602 of obtaining a substrate comprising a hardmask. In some embodiments, the hardmask comprises at least one of a boron component, a silicon component, a chromium component, a zirconium component, or any combination thereof. In some embodiments, the method 600 comprises a step 604 of obtaining a composition for polishing the hardmask. In some embodiments, the composition comprises a permanganate ion of a permanganate oxidizer. In some embodiments, the method 600 comprises a step 606 of contacting the composition and the hardmask using a chemical mechanical planarization apparatus sufficient to remove at least a portion of the hardmask. It will be appreciated that any of the compositions, the substrates, and the CMP apparatuses disclosed herein may be employed without departing from the scope of this disclosure.

Example 1

Compositions without Abrasive Particles

Compositions were prepared with different catalysts and used to polish a hardmask. A control composition without a catalyst was also prepared for comparison purposes. None of the compositions comprised any abrasive particles. The material removal rates of the various compositions were measured using a CMP apparatus equipped with a CMP pad available from Dupont (IC1010 CMP Polishing Pad) and operating at a pressure of 21 kPa, a platen speed of 120 rpm, and a head speed of 60 rpm, on a non-carbon wafer containing about 99% boron. For each composition, the oxidizer, the catalyst, and the material removal rate (MRR) are summarized in Table 1 below.

TABLE 1

| Sample | Oxidizer | Catalyst | MRR (Å/min) |
|---|---|---|---|
| A | KMnO4 | None | 124 |
| B | KMnO4 | Zirconium Oxynitrate | 848 |
| C | KMnO4 | Inorganic acid | 243 |
| D | KMnO4 | Lewis acid | 250 |
| E | H2O2 | Lewis acid | 12 |
| F | K2S2O8 | Inorganic acid | 30 |

Example 2

Compositions with Abrasive Particles

Compositions were prepared with different catalysts and with different abrasive particles. The resulting compositions were used to polish a hardmask. The material removal rates of the various compositions were measured using a CMP apparatus equipped with a CMP pad available from Dupont (IC1010 CMP Polishing Pad) and operating at a pressure of 21 kPa, a platen speed of 120 rpm, and a head speed of 60 rpm, on a non-carbon wafer containing about 97% boron. For each composition, the oxidizer, the oxidizer concentration (weight percentage), the abrasive type, the abrasive concentration (weight percentage), the catalyst, and the material removal rate (MRR) are summarized in Table 2 below. All weight percentages are based on a total weight of each composition.

TABLE 2

| Sample | Oxidizer | Oxidizer (wt %) | Abrasive | Abrasive (wt %) | Catalyst | MRR (Å/min) |
|---|---|---|---|---|---|---|
| G | KMnO4 | 1.2 | Silica | 0.05 | Zirconium Oxynitrate | 221 |
| H | KMnO4 | 1.2 | Silica | 0.1 | Inorganic acid | 187 |

TABLE 2-continued

| Sample | Oxidizer | Oxidizer (wt %) | Abrasive | Abrasive (wt %) | Catalyst | MRR (Å/min) |
|---|---|---|---|---|---|---|
| I | KMnO4 | 1.2 | Silica | 0.2 | Zirconium Oxynitrate | 465 |
| J | KMnO4 | 1.2 | Zirconia | 0.06 | Zirconium Oxynitrate | 431 |
| K | KMnO4 | 1.2 | Zirconia | 0.2 | Inorganic acid | 358 |
| L | KMnO4 | 1.2 | Alpha Alumina | 0.05 | Zirconium Oxynitrate | 599 |
| M | KMnO4 | 1.2 | Alpha Alumina | 0.1 | Inorganic acid | 376 |
| N | KMnO4 | 1.2 | Alpha Alumina | 0.3 | Zirconium Oxynitrate | 1353 |
| O | KMnO4 | 1.2 | Gamma Alumina | 0.05 | Zirconium Oxynitrate | 789 |
| P | KMnO4 | 1.2 | Gamma Alumina | 0.1 | Zirconium Oxynitrate | 895 |
| Q | KMnO4 | 1.2 | Gamma Alumina | 0.3 | Inorganic acid | 387 |

Example 3

Compositions with Different Oxidizers

Compositions were prepared with different oxidizers and used to polish a hardmask. The material removal rates of the various compositions were measured using a CMP apparatus equipped with CMP pads available from Dupont (IC1010 CMP Polishing Pad and IK4250H CMP Polishing Pad) and operating at a pressure of 21 kPa, a platen speed of 120 rpm, and a head speed of 60 rpm, on a non-carbon wafer containing about 97% boron. For each composition, the oxidizer, the oxidizer concentration (weight percentage), the abrasive type, the abrasive concentration (weight percentage), the catalyst, the various material removal rates (MRR), and the selectivity are summarized in Table 3 and Table 4 below. All weight percentages are based on a total weight of each composition.

TABLE 3

| Sample | Oxidizer | Oxidizer (wt %) | Abrasive | Catalyst |
|---|---|---|---|---|
| S | KMnO4 | 0.8 | Alpha Alumina | Zirconium Oxynitrate |
| T | KMnO4 | 0.8 | Gamma Alumina | Zirconium Oxynitrate |
| U | KMnO4 | 0.8 | Boehmite | Zirconium Oxynitrate |
| V | KMnO4 | 1.2 | Silica | Zirconium Oxynitrate |
| W | K2S2O8 | 2.7 | Alpha Alumina | Inorganic acid |
| X | H2O2 | 2 | Silica | Lewis acid |
| Y | H2O2 | 3 | Alpha Alumina | Lewis acid |

TABLE 3-continued

| Sample | Oxidizer | Oxidizer (wt %) | Abrasive | Catalyst |
|---|---|---|---|---|
| Z | NaOCl | 1 | Silica | Lewis acid |
| AA | NaOCl | 1 | Silica | None |

TABLE 4

| Sample | B—Si MRR (Å/min) | TOX MRR (Å/min) | B—Si:TOX Selectivity |
|---|---|---|---|
| S | 1456 | 72 | 20.22 |
| T | 1197 | 58 | 20.64 |
| U | 894 | 45 | 19.87 |
| V | 586 | 287 | 2.04 |
| W | 44 | 56 | 0.79 |
| X | 24 | 178 | 0.13 |
| Y | 56 | 78 | 0.72 |
| Z | 112 | 297 | 0.38 |
| AA | 321 | 211 | 1.52 |

Example 4

Compositions with Different pHs

Compositions were prepared with different pHs and used to polish a hardmask. The material removal rates of the various compositions were measured using a CMP apparatus equipped with a CMP pad available from Dupont (IC1010 CMP Polishing Pad) and operating at a pressure of 21 kPa, a platen speed of 120 rpm, and a head speed of 60 rpm, on a non-carbon wafer containing about 97% boron. For each composition, the oxidizer, the catalyst, the operational pH, and the material removal rate (MRR) are summarized in Table 5 below.

TABLE 5

| Sample | Oxidizer | Oxidizer (wt %) | Abrasive | Catalyst | Operational pH | MRR (Å/min) |
|---|---|---|---|---|---|---|
| BB | KMnO4 | 0.8 | Alpha Alumina | Zirconium Oxynitrate | 2.1 | 1454 |
| CC | KMnO4 | 0.8 | Alpha Alumina | Lewis acid | 3.5 | 423 |
| DD | KMnO4 | 0.8 | Alpha Alumina | Inorganic acid | 7.2 | 254 |
| EE | KMnO4 | 0.8 | Alpha Alumina | Inorganic acid | 9.5 | 173 |

Example 5

Polishing at Different Pressures

A composition was prepared comprising 0.8% by weight of $KMnO_4$ based on a total weight of the composition, 0.1% by weight of alpha alumina abrasive particles based on the total weight of the composition, 0.5% by weight of boehmite abrasive particles based on the total weight of the composition, and 0.2% by weight of zirconium oxynitrate based on the total weight of the composition. The composition was used to polish a boron-amorphous silicon hardmask at different pressures. The material removal rates of the composition at the different pressures were measured using a CMP apparatus equipped with a CMP pad available from Dupont (IC1010 CMP Polishing Pad) and operating at a pressure of 21 kPa, a platen speed of 120 rpm, and a head speed of 60 rpm, on the hardmask. The material removal rate at each pressure for boron-amorphous silicon hardmasks having different levels of boron content are summarized in Table 6 below.

TABLE 6

| Sample | Boron Content | 1 psi | 3 psi | 5 psi |
|---|---|---|---|---|
| FF | Low | 41 | 127 | 323 |
| GG | High | 1004 | 1610 | 3198 |
| HH | Mid | 952 | 1456 | 2492 |

ASPECTS

Various Aspects are described below. It is to be understood that any one or more of the features recited in the following Aspect(s) can be combined with any one or more other Aspect(s).

Aspect 1. A system comprising:

a composition comprising a permanganate ion of a permanganate oxidizer, a substrate comprising a hardmask that comprises at least one of a non-carbon boron component, a boron-carbon component, a non-carbon silicon component, a non-carbon chromium component, a non-carbon zirconium component, or any combination thereof; and a chemical mechanical planarization (CMP) apparatus configured to bring the composition and the substrate into contact so as to remove at least a portion of the hardmask of the substrate.

Aspect 2. The system according to Aspect 1, wherein the permanganate oxidizer comprises at least one of sodium permanganate, potassium permanganate, lithium permanganate, barium permanganate, hydrogen permanganate, or any combination thereof.

Aspect 3. The system according to any one of Aspects 1-2, wherein the permanganate ion comprises.

Aspect 4. The system according to any one of Aspects 1-3, wherein the hardmask comprises boron and amorphous silicon.

Aspect 5. The system according to any one of Aspects 1-4, wherein the hardmask comprises chromium and chromium oxide.

Aspect 6. The system according to any one of Aspects 1-5, wherein the hardmask comprises polysilicon and doped polysilicon.

Aspect 7. The system according to any one of Aspects 1-6, wherein the hardmask comprises silica.

Aspect 8. The system according to any one of Aspects 1-7, wherein the hardmask comprises zirconia.

Aspect 9. The system according to any one of Aspects 1-8, wherein the composition further comprises at least one of an ion of a metal-oxy catalyst, an ion of an acid catalyst, or any combination thereof.

Aspect 10. The system according to any one of Aspects 1-9, wherein the composition further comprises abrasive particles having a Mohs hardness of 2 to 9.

Aspect 11. The system according to any one of Aspects 1-10, wherein the composition further comprises a pH adjuster.

Aspect 12. A method comprising:

obtaining a substrate comprising a hardmask that comprises at least one of a boron component, a silicon component, a chromium component, a zirconium component, or any combination thereof;

obtaining a composition comprising a permanganate ion of a permanganate oxidizer; and contacting the composition and the hardmask using a chemical mechanical planarization apparatus sufficient to remove at least a portion of the hardmask.

Aspect 13. The method according to Aspect 12, wherein the permanganate oxidizer comprises at least one of sodium permanganate, potassium permanganate, lithium permanganate, barium permanganate, hydrogen permanganate, or any combination thereof.

Aspect 14. The method according to any one of Aspects 12-13, wherein the permanganate ion comprises $MnO^{-}$ 4.

Aspect 15. The method according to any one of Aspects 12-14, wherein the hardmask comprises boron and amorphous silicon.

Aspect 16. The method according to any one of Aspects 12-15, wherein the hardmask comprises chromium and chromium oxide.

Aspect 17. The method according to any one of Aspects 12-16, wherein the hardmask comprises polysilicon and doped polysilicon.

Aspect 18. The method according to any one of Aspects 12-17, wherein the hardmask comprises silica.

Aspect 19. The method according to any one of Aspects 12-18, wherein the hardmask comprises zirconia.

Aspect 20. A composition comprising:

a permanganate ion of a permanganate oxidizer, wherein the composition, when brought into contact with a hardmask using a chemical mechanical planarization apparatus, removes at least a portion of the hardmask, wherein the hardmask comprises at least one of a non-carbon boron component, a boron-carbon component, a non-carbon silicon component, a non-carbon chromium component, a non-carbon zirconium component, or any combination thereof.

It is to be understood that changes may be made in detail, especially in matters of the construction materials employed and the shape, size, and arrangement of parts without departing from the scope of the present disclosure. This Specification and the embodiments described are examples, with the true scope and spirit of the disclosure being indicated by the claims that follow.

What is claimed is:

1. A method comprising:

obtaining a substrate comprising a hardmask formed of non-carbon material or boron-carbon material, wherein the hardmask comprises boron and amorphous silicon;

obtaining a composition comprising a permanganate ion of a permanganate oxidizer, further comprising a metal-oxy catalyst comprising at least one of zirconium oxynitrate, zirconium oxychloride, nickel oxynitrate, nickel oxychloride, hafnium oxynitrate, hafnium oxychloride, zirconium oxy-alkanoates; and contacting the composition and the hardmask using a chemical mechanical planarization apparatus to remove at least a portion of the hardmask.

2. The method of claim 1, wherein the permanganate oxidizer comprises at least one of sodium permanganate, potassium permanganate, lithium permanganate, barium permanganate, hydrogen permanganate, or any combination thereof.

3. The method of claim 1, wherein the permanganate ion comprises $MnO_4^-$.

* * * * *